(12) United States Patent
Roche et al.

(10) Patent No.: US 6,830,650 B2
(45) Date of Patent: Dec. 14, 2004

(54) WAFER PROBE FOR MEASURING PLASMA AND SURFACE CHARACTERISTICS IN PLASMA PROCESSING ENVIRONMENTS

(75) Inventors: Gregory A. Roche, Fort Collins, CO (US); Leonard J. Mahoney, Fort Collins, CO (US); Daniel C. Carter, Fort Collins, CO (US); Steven J. Roberts, Severance, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 74 days.

(21) Appl. No.: 10/194,526

(22) Filed: Jul. 12, 2002

(65) Prior Publication Data

US 2004/0007326 A1 Jan. 15, 2004

(51) Int. Cl.$^7$ .............................. H05H 1/00; C23C 16/00
(52) U.S. Cl. .............................. 156/345.24; 156/345.28; 118/712
(58) Field of Search ........................ 156/345.24, 345.27, 156/345.28; 118/712, 715

(56) References Cited

U.S. PATENT DOCUMENTS

| | | | |
|---|---|---|---|
| 5,444,637 A | 8/1995 | Smesny et al. | |
| 5,526,293 A | 6/1996 | Mozumder et al. | |
| 5,594,328 A | 1/1997 | Lukaszek | |
| 5,801,386 A | 9/1998 | Todorov et al. | |
| 5,885,402 A | * 3/1999 | Esquibel ................ | 156/345.24 |
| 5,959,309 A | 9/1999 | Tsui et al. | |
| 5,967,661 A | 10/1999 | Renken et al. | |
| 5,969,639 A | 10/1999 | Lauf et al. | |
| 6,190,040 B1 | 2/2000 | Renken et al. | |
| 6,033,922 A | 3/2000 | Rowland et al. | |
| 6,051,443 A | 4/2000 | Ghio et al. | |
| 6,244,121 B1 | 6/2001 | Hunter | |
| 6,325,536 B1 | 12/2001 | Renken et al. | |
| 6,458,239 B1 | * 10/2002 | Bhardwaj et al. ...... | 156/345.24 |
| 6,576,922 B1 | 6/2003 | Ma et al. | |
| 6,614,051 B1 | 9/2003 | Ma | |
| 6,616,332 B1 | 9/2003 | Renken et al. | |
| 6,691,068 B1 | 2/2004 | Freed et al. | |
| 6,738,722 B2 | 5/2004 | Polla et al. | |
| 2002/0173059 A1 | 11/2002 | Ma | |

FOREIGN PATENT DOCUMENTS

WO     WO 02/17030 A2     2/2002

OTHER PUBLICATIONS

Mason Freed, et al.; Autonomous On–Wafer Sensors for Process Modeling, Diagnosis, and Control; IEEE Transactions on Semiconductor Manufacturing, vol. 14, No. 3, Aug. 2001; pp. 255–264.

Shawming Ma, et al.; Prediction of Plasma Charging Induced Gate Oxide Tunneling Current and Antenna Dependence by Plasma Charging Probe; 1996 1$^{st}$ International Symposium on Plasma Process–Induced Damage, May 13–14; pp. 20–23.

Mason Freed; In–Situ Etch Rate Sensor Arrays for Plasma Etch Processes; May 21, 1999; pp. 1–59.

* cited by examiner

*Primary Examiner*—Parviz Hassanzadeh
(74) *Attorney, Agent, or Firm*—J. D. Pirnot; Benjamin Hudson, Jr.

(57) ABSTRACT

There is provided by this invention a wafer probe for measuring plasma and surface characteristics in plasma processing environment that utilizes integrated sensors on a wafer substrate. A microprocessor mounted on the substrate receives input signals from the integrated sensors to process, store, and transmit the data. A wireless communication transceiver receives the data from the microprocessor and transmits information outside of the plasma processing system to a computer that collects the data during plasma processing. The integrated sensors may be dual floating Langmuir probes, temperature measuring devices, resonant beam gas sensors, or hall magnetic sensors. There is also provided a self-contained power source that utilizes the plasma for power that is comprised of a topographically dependent charging device or a charging structure that utilizes stacked capacitors.

15 Claims, 12 Drawing Sheets

Figure 7a
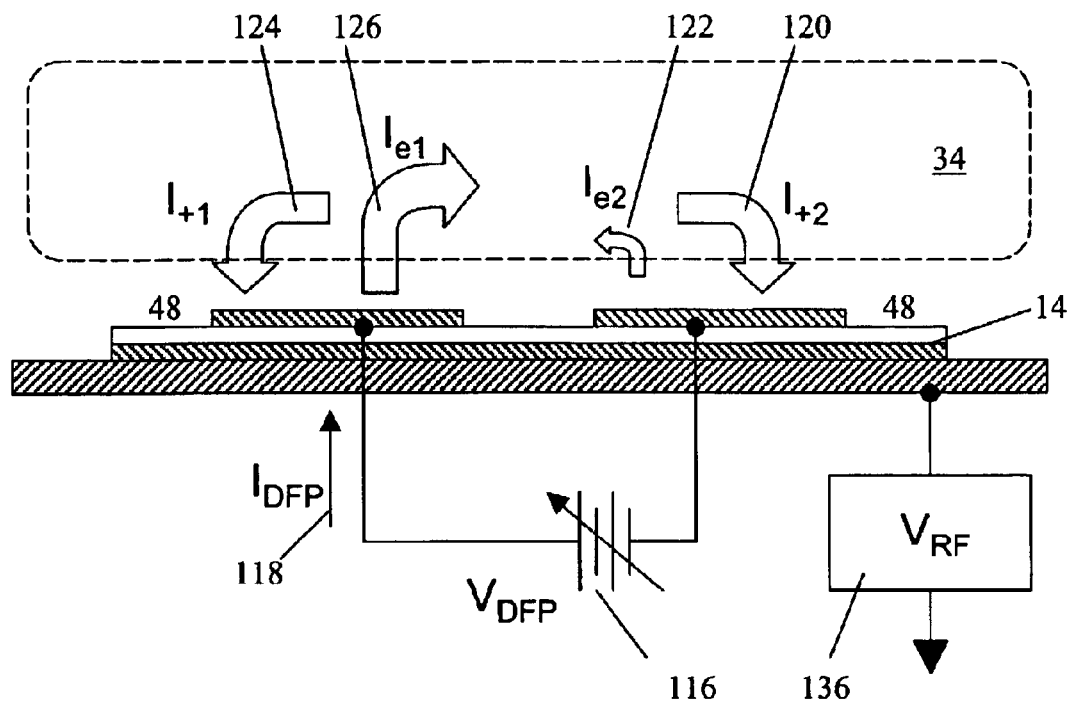
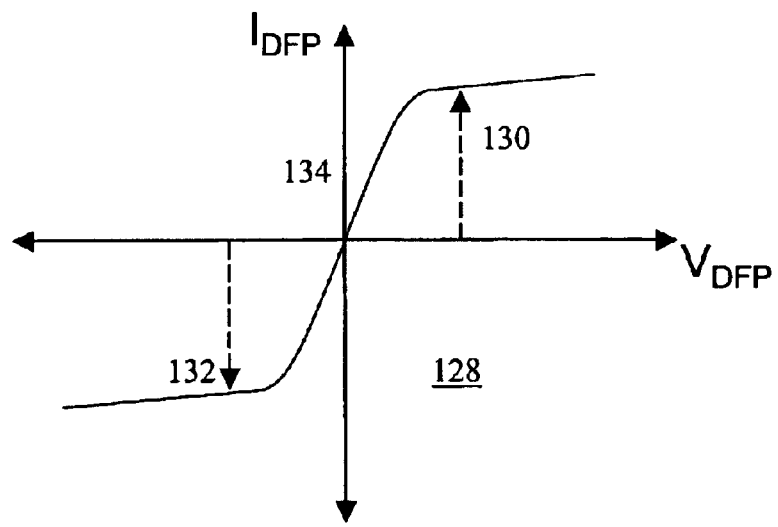
Figure 7b

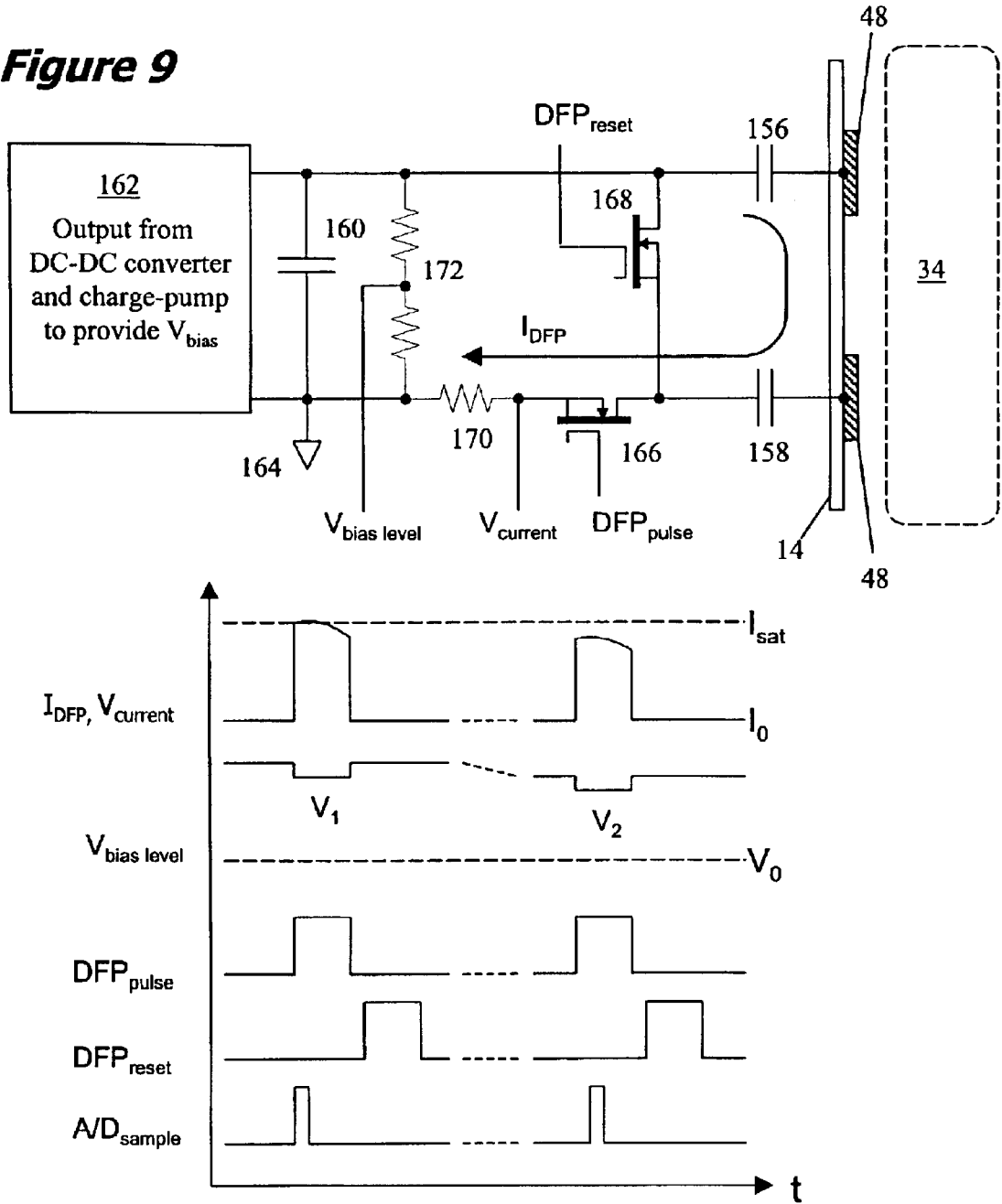

WAFER PROBE FOR MEASURING PLASMA AND SURFACE CHARACTERISTICS IN PLASMA PROCESSING ENVIRONMENTS

BACKGROUND OF THE INVENTION

1. Field of the Invention

This invention relates generally to apparatus and methods in which surface-based sensors measure incident charged-particle currents, charging voltages, temperatures and other physical parameters at a work piece surface during plasma processing, and more particularly to a semiconductor wafer utilizing surface-based sensors to provide real time measurement of plasma characteristics adjacent to the wafer surface as well as select physical properties during plasma processing.

2. Brief Description of the Prior Art

Spatial and temporal variation in plasma characteristics and the work piece surface temperature can strongly influence the performance and yield of plasma-based processes, such as those encountered in semiconductor manufacture. In such processes, variations in physical plasma parameters that occur adjacent to the process work piece directly impact process metrics which may include the following: (1) etch rates and etch profile control, (2) surface charging effects and device or film damage, and (3) thin film deposition rates, density, coverage, morphology, stress and adhesion. Some common plasma parameters that drive surface processes on a work piece, such as a semiconductor substrate wafer, include charged-particle density and flux (ion and electron density), apparent electron temperature, ion energies, neutral gas temperature, density and flux of reactive gas species, and plasma radiative emissions. It is also known that surface temperature of the work piece or wafer can play a very critical role in many of the surface reactions and results of the plasma process.

Because of the criticality of both plasma characteristics and substrate temperature and their impact on process yield, several workers have attempted to monitor plasma characteristics and surface temperatures during processes by means of diagnostic probes that are directly mounted to a work piece, such as a semiconductor wafer substrate. In these devices, diagnostic probes such as thermocouples, DC-biased electrical probes, ion energy analyzers, and surface charging collectors have been used to measure spatial and temporal variation of surface temperature, selected plasma parameters, and plasma-induced charging effects. One such device is the Stanford Plasma On-wafer Real Time (SPORT) probe as described in an article by S. Ma and J. P. McVittie in the proceedings of the 1996 International Symposium on Plasma Process-Induced Damage pg. 20–23. The SPORT probe is capable of measuring electrostatic charging and plasma-induced currents at the wafer surface. The SPORT probe utilizes large conductive pads placed on a thick oxide layer of a silicon wafer. Polysilicon leads make direct current contact to the pads and the silicon substrate. Wire leads connected to the edge of the wafer carry current and voltage signals outside the plasma-processing chamber to a low pass RF filter to a dc measurement circuit. By means of the external measurement circuit, plasma induced charging voltages are measured between the pads and the substrate in order to quantify plasma induced electrostatic charging effects that could result in damage to electrically sensitive semiconductor device structures during plasma processing and fabrication.

Another apparatus is described in U.S. Pat. No. 5,801,386 issued to Valentin N. Todorov et al. This patent discloses an apparatus that comprises a plurality of conductive collector pads for detection of plasma induced ion currents and self-biased voltages. The collector pads are arranged in an array so that plasma-induced properties of ion current and self-bias voltage can be spatially resolved over the wafer surface in real time. Each collector pad is connected to a conductive lead that extends outside the chamber to an external data acquisition system.

Also in U.S. Pat. No. 5,959,309 entitled "Sensor to Monitor Plasma Induced Charging Damage", Tsui, et al. describe a discrete monitoring circuit that measures the plasma-induced voltage and currents to a sampling pad or antenna that is in communication with a ground or common. In this device, the sampling pad is connected to ground through a blocking diode, a blocking transistor, and a storage capacitor. Once the monitor is exposed to the plasma, the voltage between the charged pad or antenna and the electrical common or ground is recorded by charging a storage capacitor. The workers also disclosed how a plurality of these monitors, each with different loading resistances, can be integrated onto a single chip to measure the magnitude of the charging voltage and the plasma-induced current between the antenna and common or ground of the chip. The charging voltage and pad-to-common currents are determined by electrically measuring the voltages of the storage capacitors after the sensor or chip is removed from the plasma processing environment.

Freed et al. describe the development of sensor methods in "Autonomous On-Wafer Sensors for Process Modeling, Diagnostic and Control" (IEEE Transactions on Semiconductor Manufacturing, Vol. 14, No. 3, pp 225–264). This paper describes the basic design challenges faced in the development of an in situ or in-line wafer sensor including power source concepts, wireless communications methods, and electrical isolation of on-wafer electronics. In their examples, they illustrate two design concepts. In the first design concept is an on-wafer thermistor sensor powered with re-chargeable batteries and voltage regulator. The design also includes an A/D converter and LED optical communication electronics for transferring data off the wafer in a thermally elevated process environment and a plasma etching environment. In another version of the design, the workers illustrate how a van der Pauw sheet resistance device may be adapted with CMOS processing methods for measuring polysilicon etch rates. They demonstrate the viability of this sensor with a wired wafer as applied to a $XeF_2$ (non-plasma) etching reactor. These devices have varying degrees of effectiveness in monitoring the wafer temperature or the characteristics of a plasma body adjacent to the wafer when disposed in a plasma processing environments. However, all the examples of the prior art have several limitations that restrict their use for obtaining real-time plasma and substrate temperature measurement within a plasma processing system. Many of these measuring devices are intrusive in that they require the use of wires into the plasma processing system and others are passive recording devices that cannot make real-time measurements. Also, those devices that do not use external wires are limited in on-time operation and power supply current draw since they rely entirely upon on-board battery power sources that have limited milliamp-per-hour capacity or limited sustainable trickle current capacity when attempting to power a sizable array of sensors, microprocessor(s) and wireless communication subsystems. Moreover, in the context of these in situ measurement apparatuses, none of the prior art teachings discuss in detail how to devise a sensor capable of obtaining plasma measurements, such as charged-particle (ion or electron) fluxes, densities and energies that can be adapted to a wireless sensing apparatus.

It would be desirable if there were provided a surface-based sensor apparatus that could make spatially resolved, real-time measurements of plasma properties adjacent to the surface of the apparatus, as well as other properties such as surface temperature. It would also be desirable if the device were non-invasive to the plasma process and if the time-dynamic data recorded by the device could be either transmitted in real-time through a wireless interface or, alternatively, be recorded for downloading once the sensor apparatus is removed from the plasma process chamber. It would be further desirable if the device had a self-contained power supply means that did not rely entirely upon the limited lifetime or trickle current ratings of a battery or alternative conventionally power source.

SUMMARY OF THE INVENTION

There is provided by this invention an apparatus for making real time measurements of incident plasma currents, charging surface voltages, and other plasma related parameters as well as surface temperatures within a plasma processing environment. The apparatus is generally comprised of at least one integrated sensor circuit mounted on a work piece such as a silicon wafer substrate. The sensor is comprised of either a dual floating probe to measure ion currents from the plasma, a topographical dependent charging structure to measure plasma induced surface charging effects, filtered photodiodes to measure optical emissions signals, a thermal sensing device to monitor surface temperature or a combination thereof The sensor inputs are transmitted to a central microprocessor and transceiver that is provided for processing sensor signals, memory storage, and real-time transmission of data via infrared- or rf-wireless communication to a receiver outside the plasma chamber. To power the apparatus, a battery is contained within the apparatus to provide power to the integrated sensor devices, microprocessor and wireless transceiver. Alternately, the apparatus may include one or more topographically dependent charging structures to electrostatically couple power from the plasma boundary that is then regulated and used to provide all or part of the power to the apparatus electronics. The apparatus is particularly useful in spatial and real-time monitoring of plasma and substrate conditions in plasma-based non-depositing processes such as etching, photo-resist stripping or surface cleaning, but could be applied to some plasma-based deposition processes with the appropriate configuration or adaptation of the integrated sensing devices.

BRIEF DESCRIPTION OF THE DRAWINGS

FIG. 7 illustrates a block diagram of a dual floating probe (DFP) structure with a typical current-voltage response curve when exposed to a plasma and voltage bias signal;

FIG. 9 illustrates a topography dependent charging (TDC) structure in the presence of a plasma and means by which a voltage is induced on the structure by a plasma;

BRIEF DESCRIPTION OF THE PREFERRED EMBODIMENT

Figure 1:
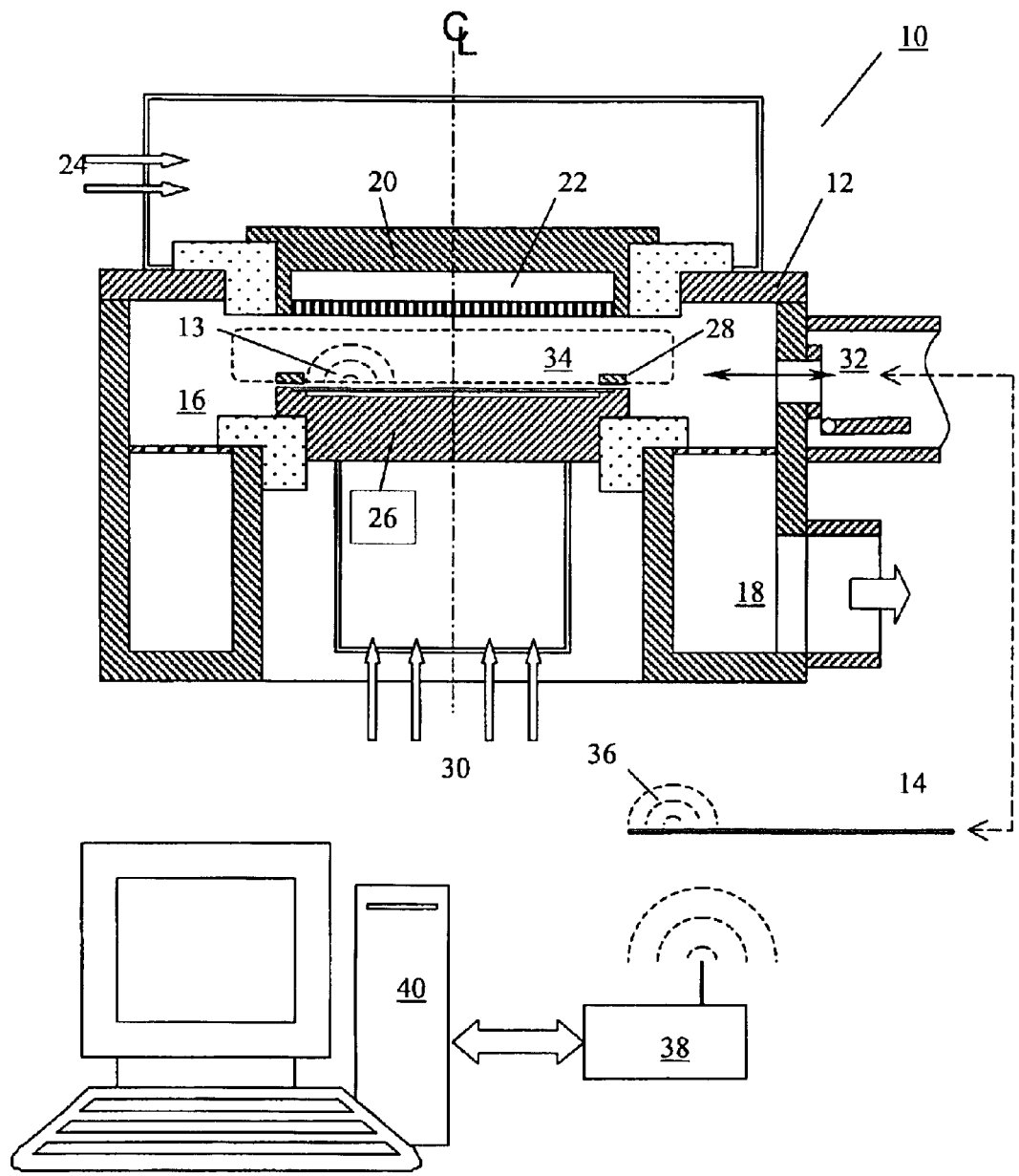
FIG. 1 illustrates a simplified cross-sectional view of a semiconductor manufacturing process chamber in which to utilize the sensor apparatus for measurements across the surface of a wafer or work piece.

Referring to FIG. 1 there is illustrated an apparatus 10 that is capable of making real-time measurements of incident plasma current flux and surface temperatures of a work piece in a plasma processing system 12. In this particular illustration a diagnostic probe 14 is comprised of a silicon wafer substrate that incorporates plasma probe and surface temperature diagnostic circuitry and wireless communications and a stored power system. In the preferred embodiment, the probe 14 is powered up outside the plasma processing system 12 to enable diagnostic communications prior to use for real-time measurements. The plasma processing system of FIG. 1 is one of many possible plasma processing systems and is presented here to illustrate the function and use of the present invention. The processing system is comprised of a vacuum processing chamber 16, a pumping manifold 18, a plasma source electrode mounted to the top of the chamber 20, a gas delivery manifold or gas shroud 22, gas flow and power connections to the plasma source electrode 24, a wafer chuck 26 with clamp ring 28, RF power, fluid coolant, lifting pin, and helium backside-cooling services to the chuck 30, and a load lock transfer stage with mechanical robotics 32 to manipulate the wafer into the chamber 16 onto the chuck 26. Plasma 34 is ignited to perform an etching or deposition process on the surface of the wafer at which time the apparatus sensors and microprocessor is triggered to collect surface properties or plasma properties in close proximity to the apparatus surface in real time. An on-board wireless transceiver system 36 is used to communicate data and instruction with a base station transceiver 38 outside the plasma processing system. The base station transceiver 38 allows for communication of data and instructions between the software of the external computer 40 and the probe 14 in real time. Alternatively, it is possible to have the probe collect information inside the process and then download data once it is removed from the process chamber.

Figure 2A:
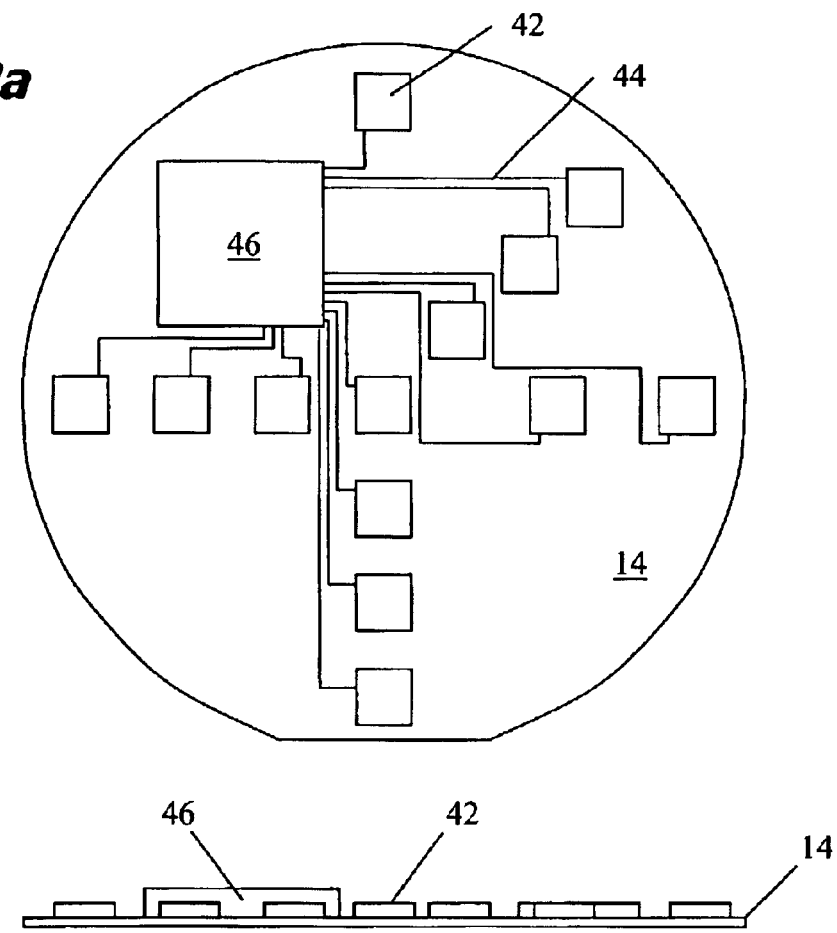
FIG. 2a illustrates the sensor apparatus of the invention as manufactured on a silicon wafer substrate and which is comprised of a plurality of integrated circuit sensors and a central microprocessor with wireless communication capability.
Figure 2B:
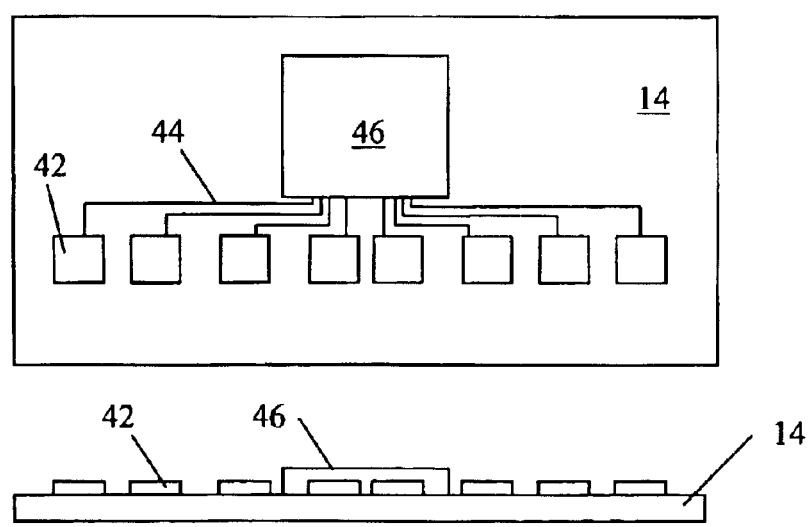
FIG. 2b illustrates the sensor apparatus of the invention as manufactured on a vacuum compatible work piece and which is comprised of a plurality of integrated circuit sensors and a central microprocessor with wireless communication capability.

In the preferred embodiment the sensors can be fabricated on a semiconductor wafer such as a 200 mm or 300 mm diameter silicon wafer. However, they may also be fabricated on any process work piece such as a ceramic, plastic, metal or glass work piece surface that can be introduced into the vacuum chamber. These configurations are illustrated in FIGS. 2a and 2b respectively. FIG. 2a shows how an array of spatially distributed sensor elements 42 are disposed on the semiconductor wafer 14 with multiple interconnects 44 for communication and/or power distribution from a central processor and wireless communication subsystem 46. FIG. 2b shows how a similar device with sensors 42, interconnects 44 and central processor with wireless communication module 46 could be patterned on any flat article or work piece 14 to be placed into the plasma processing system.

There are three specific architectures of interest that may be used in within the apparatus of the present invention. These are given as (1) single-point sensing devices with dedicated single conditioning circuitry, analog-to-digital (A/D) converter, micro-processor, wireless communications and power source;

(2) multiple-point or distributed sensing devices with analog and control signals multiplexed to a central signal condition circuitry, A/D converter, microprocessor, wireless communications and power source; and (3) multiple-point or distributed sensing devices with dedicated signal conditioning circuitry, A/D converter, local power source and with serial communications to a central micro-processor, wireless communications and power source. The choice of any particular architecture is dependent upon the need for collecting real-time spatial information, use of materials and manufacture constraints, and data collection issues related to noise immunity and speed of data collection over a distributed serial or multiplexed electrical system. These basic architectures are described in more detail hereinafter.

There are three sensor devices or means that are of particular interest for measurement of parameters at the work piece surface or from the adjacent plasma body. These sensors are used in examples to illustrate the operation and function of the apparatus. These sensors are:

a) a thermal sensing element, such as a thermocouple or thermistor, for measuring work piece temperatures;

b) a dual-floating Langmuir probe (DFP) for measuring plasma ion current fluxes, apparent electron temperatures and estimates of ion and electron densities;

c) a topographically dependent charging (TDC) devices for measuring surface charging effects and for coupling power from the plasma sheath.

The common aspect of these particular sensor devices is that they are examples of sensing devices that can be electrically floated and thus they are viable for sensing process properties on a work piece when the work piece is electrically floating or if there is an active RF self-bias applied to the work piece. In such cases there can be no ground connection between the processing system ground and the work piece. These sensing devices may be used alone or in certain combinations depending upon the needs or the application. While these three specific devices are used to describe the apparatus or the present invention, there are other possible sensors that may be used in the context of the apparatus, which are described in the following specification.

Figure 3:
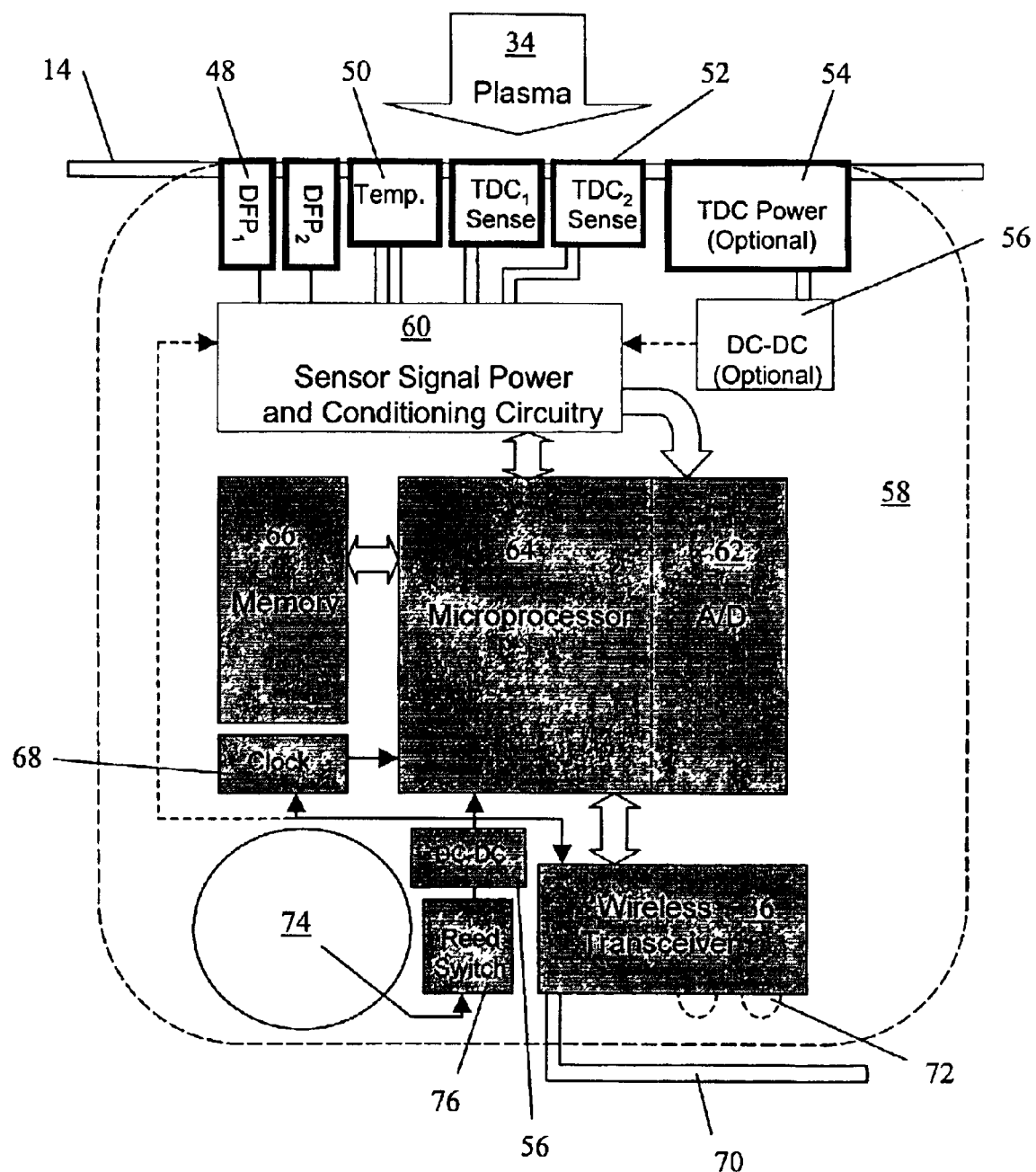
FIG. 3 illustrates a schematic diagram that is representative of the electrical architecture of invention in which output of a discrete sensor is collected by microprocessor with signal processing and wireless communication capability.

FIG. 3 is an illustration of a single point sensing architecture of the apparatus of the present invention. The sensors are mounted to a surface of the wafer 14 such that they are exposed to the flux of charged-particle species from the plasma 34. In this case the multiple sensors include electrodes to a dual-floating Langmuir probe 48, a surface temperature sensor 50, topographically dependent charging sensors 52 with varying aspect ratio and a TDC bank 54 that feeds a voltage to a DC-DC converter and regulator 56 for optional or auxiliary sensor power. A protective package 58 is used to shield most all other electronics from the exposure to the plasma environment. The supporting electronic architecture includes a sensor signal power and conditioning circuit 60, an A/D converter section for analog signals 62, a central microprocessor 64, additional memory 66, a crystal oscillator 68 and the wireless transceiver 36 that includes a radio antenna 70. Alternately, the transceiver maybe infrared LEDs 72 as a means for wireless communications. The wafer also includes an energy source 74 which may be a capacitor or battery that powers the system through a magnetic reed switch 76 and DC-DC regulator 56. This particular arrangement is preferred when temporal data from the sensors is a critical single point or zone that is required to monitor the phenomenon in real-time.

Figure 4:
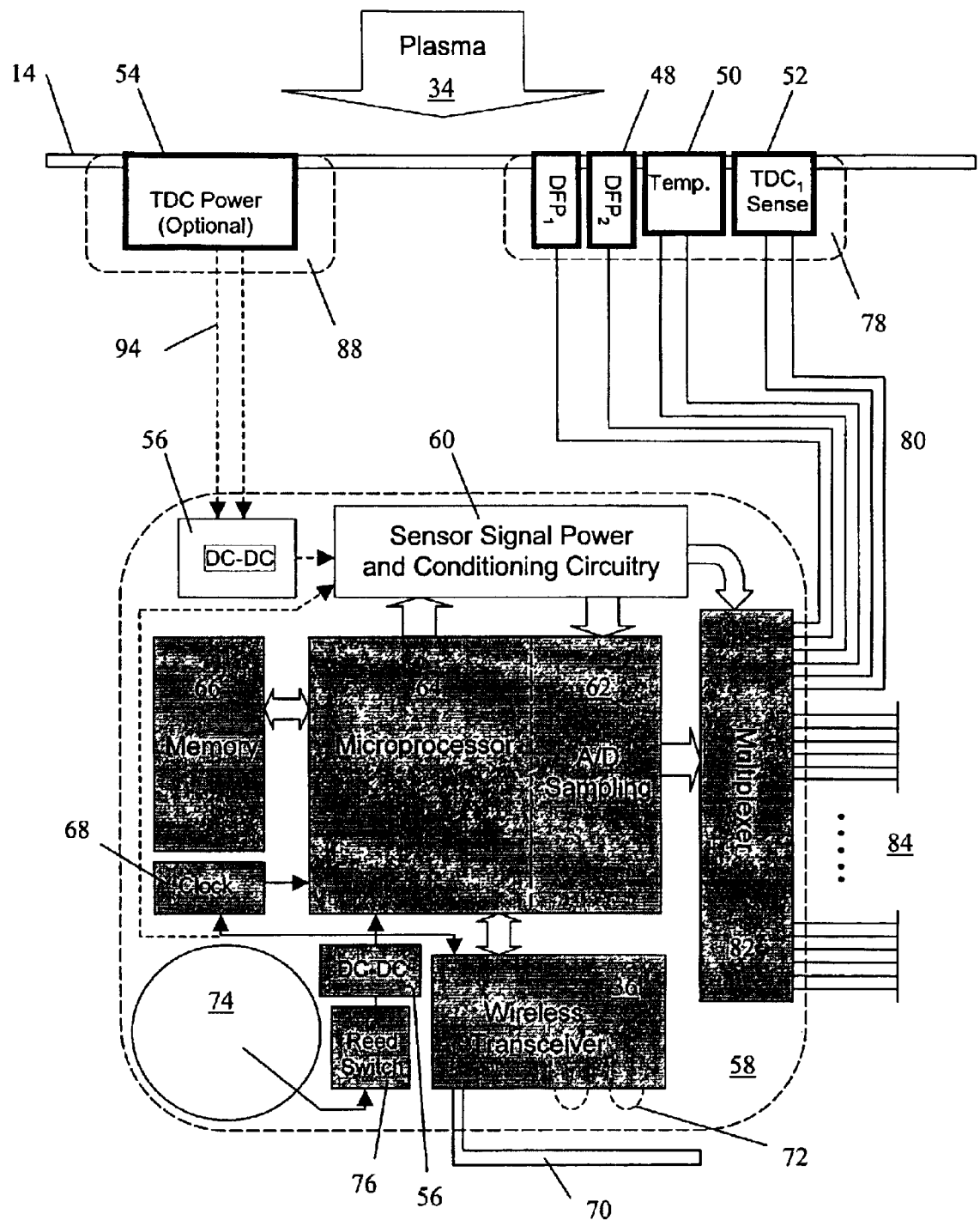
FIG. 4 illustrates a schematic diagram that is representative of electrical architecture of invention in which the analog output of a plurality of discrete sensors are transmitted to a central microprocessor with multiplexing, analog-to-digital conversion, signal processing and wireless communication capability.

FIG. 4 is an illustration of a multiple-point or distributed sensing architecture wherein several sensor signals are multiplexed to a central signal condition circuitry, A/D converter, microprocessor. As with the prior architecture, the sensors are mounted to a surface of the wafer 14 such that they are exposed to the flux of charged-particle species from the plasma 34. However in this arrangement, several multi-sensor modules 78 are separate from the electronics enclosure 58, yet have communication lines 80 to a multiplexing component 82. In this manner, the signal from several multi-sensor modules, which may be built up from repeated hybrid devices or system-on-chip modules, can be spatially polled through an array of distributed communication lines 84. Each multi-sensor module 78 includes electrodes for the DFP 48, the surface temperature sensor 50, and a TDC sensor 52 for recording surface charging. An optional TDC bank 54 may be included in a separate module package 88 in order to power the DC-DC converter and regulator 56 for optional or auxiliary sensor power. In this multiplexing arrangement, the supporting electronic architecture includes the multiplexer 82, the sensor signal power and conditioning circuit 60, the A/D converter section for analog signals 62, the central microprocessor 64, additional memory 66, the crystal oscillator 68 and wireless transceiver 36 that has either the radio antenna 70 or the infrared LEDs 72 as a means for wireless communications. As with the first architecture, the second architecture includes an energy source 74 which may be a capacitor or battery that powers the system through the magnetic reed switch 76 and DC-DC regulator 56. This particular arrangement is preferred when temporal and spatial data from several replicated sensor modules 78 can be collected with little risk of noise and interference along patterned communication lines 80 and 84. It would be economical to use this particular architecture as the collective elements of the central microprocessor, signal conditioning circuit, and multiplexer could be incorporated into a single Application Specific Integrated Circuit (ASIC) component or, alternatively, into an integrated multi-chip hybrid circuit. Also, with this architecture, it is possible to use a hermetically sealed electronics package for enclosure 58 and electrically insulated connections to deposited or printed conductive traces for communication lines 80 and 84 and connections 94 between TDC auxiliary power bank 54 and DC-DC regulator 56. Such preferred methods of fabrication would allow the apparatus to be fabricated on a semiconductor wafer 14 with materials that are compatible with semiconductor plasma processing environments.

Figure 5:
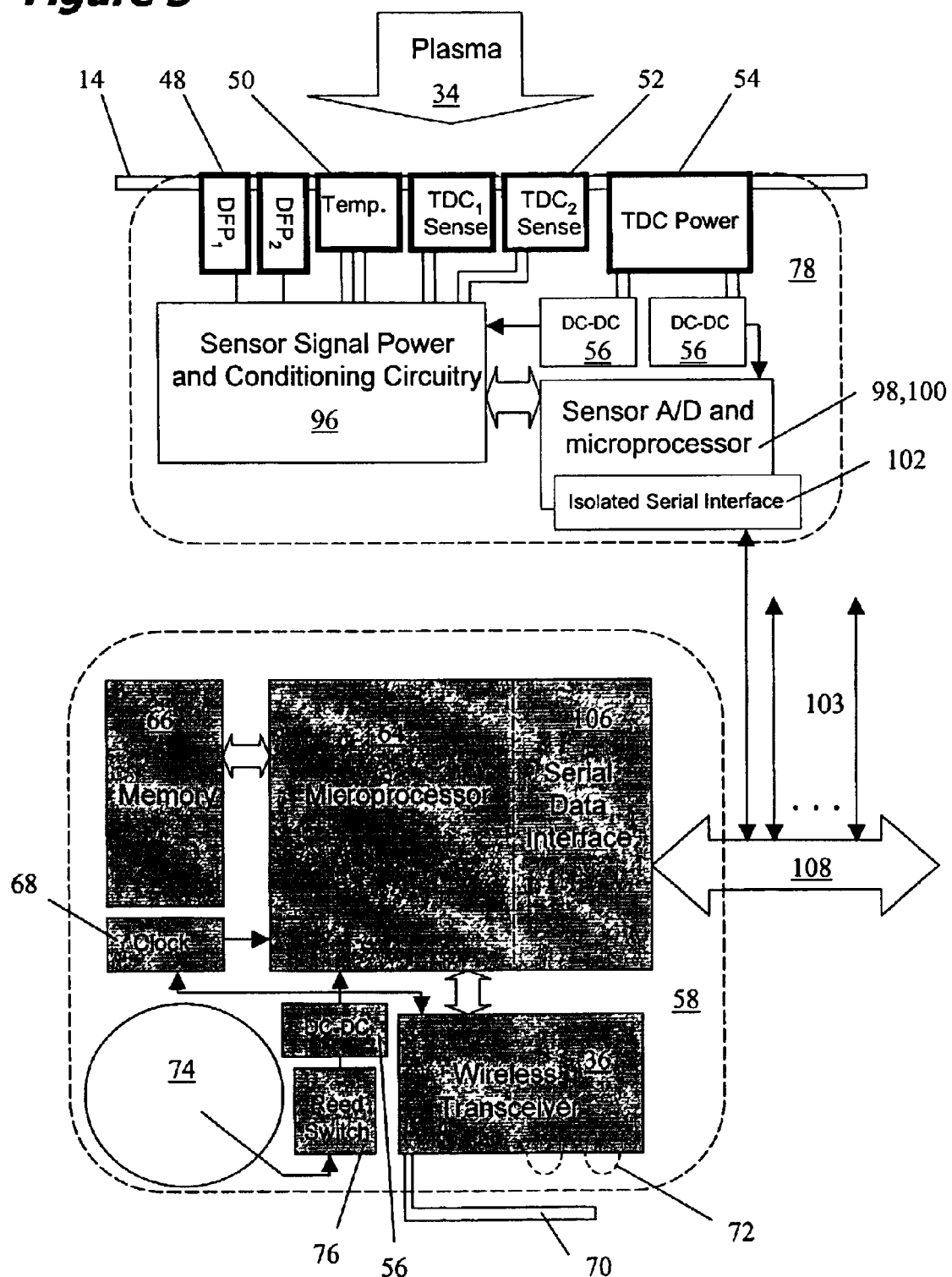
FIG. 5 illustrates a schematic diagram that is representative of electrical architecture of invention in which a plurality of discrete sensors have an integrated analog-to-digital and signal conditioning capability and are digitally tied to a central microprocessor with signal processing and wireless communication capability.

FIG. 5 is an illustration of a multiple-point sensing architecture wherein several replicated sensing modules with dedicated signal conditioning circuitry, A/D converter, and optional TDC-base power source are connected to a central microprocessor and wireless transceiver through shared serial communications. In this version of the architecture several sensor modules or subsystems 78 are mounted to a surface of the wafer 14 such that the sensing components are exposed to the flux of charged-particle species from the plasma 34. Each sensor module 78 is comprised of a DFP sensor 48, a temperature sensor 50 and at least one TDC sensor 52. An additional bank of TDC devices 54 may be used to couple power from the plasma boundary to a DC-DC regulator 56 to locally power the sensor module when operated in the presence of a plasma. In order to make local measurements, each sensor module 78 has a sensor signal power and conditioning circuit module 96, a local microprocessor 98 with A/D conversion 100 and isolation for serial communications 102. Data is transmitted to the central processor 64 within package 58 through communication lines 103 and serial interface 106 as distributed along a shared serial bus 108. As with previous apparatus architectures, the main microprocessor module 64 has additional memory 66, a crystal oscillator 68 and a wireless transceiver 36 that has either a radio antenna 70 or infrared LEDs 72 as a means for wireless communications. The module also includes an energy source 74 which may be a capacitor or battery that powers the system through a magnetic reed switch 76 and DC-DC converter 56. This arrangement is preferred when temporal and spatial data from several replicated sensor modules 78 can be fabricated from an ASIC or hybrid circuit component. The digital communications between the sensors and the central processor should provide good immunity to noise and address common mode voltage issues since analog signals are not being spatially routed over the apparatus surface. Moreover, the localized sampling and storage capability of the local microprocessors 98 may enable faster sampling rates and real-time transmission of the sensor data when compared to a multiplexed architecture as illustrated in FIG. 4.

Figure 6A:
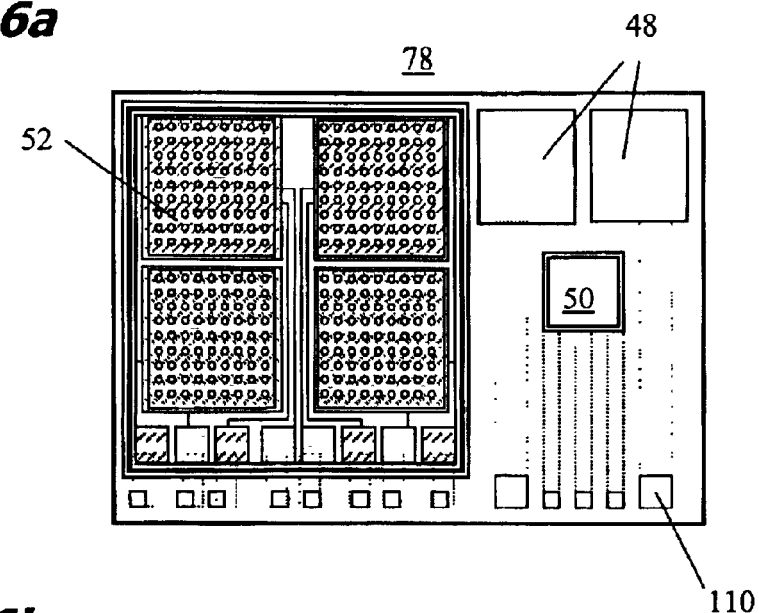
FIG. 6a illustrates the diagram of an integrated sensor which includes a thermocouple or thermistor device for monitoring surface temperatures, a dual-floating Langmuir probe for monitoring ion currents and apparent electron temperature, one or more topographical dependent charging structures for monitoring plasma-induced surface charging effect.
Figure 6B:
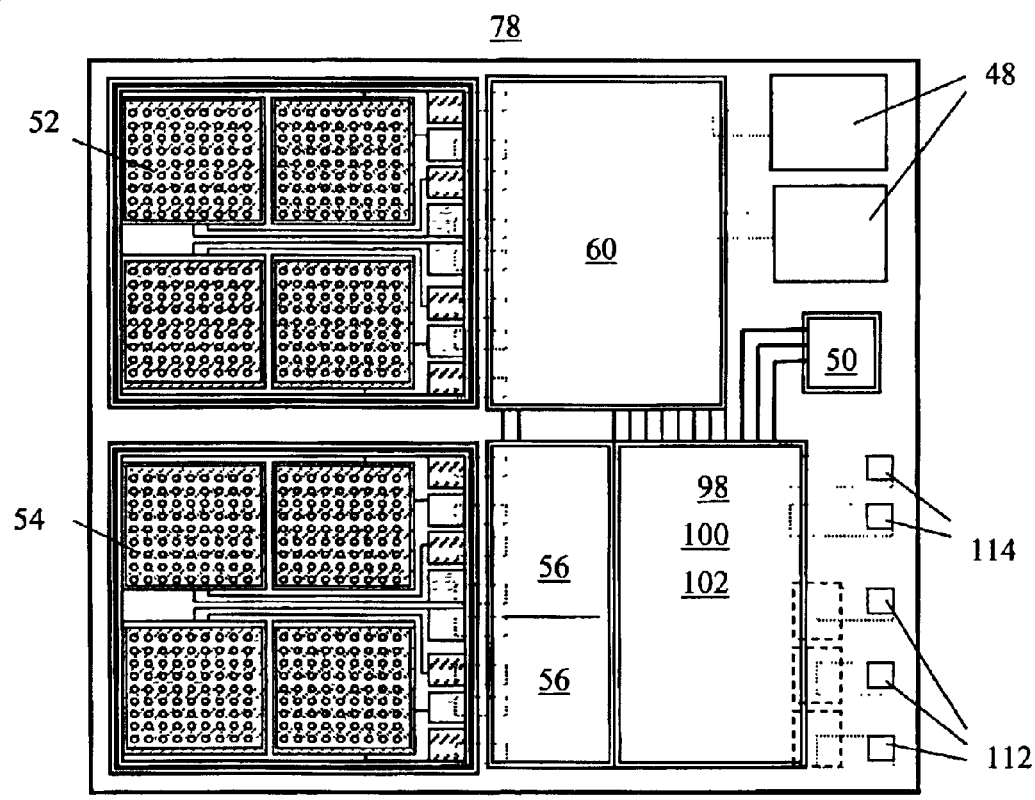
FIG. 6b illustrates the diagram of an integrated sensor which includes a thermocouple or thermistor device for monitoring surface temperatures, a dual-floating Langmuir probe for monitoring ion currents and apparent electron temperature, one or more topographical dependent charging structures for monitoring plasma-induced surface charging effect, signal conditioning circuitry and a microprocessor for analog-to-digital conversion of sensor output and serial communication.

As mentioned earlier, the surface sensor devices could be fabricated from a hybrid circuit components or an ASIC to form the replicated sensor modules 78 as shown in FIGS. 4 and 5. Such modular sub-components could be mounted on a discrete circuit substrate such as a ceramic or high temperature thermal plastic with output leads bonded to patterned interconnections on the wafer 14. Alternatively, the sensor modules and interconnections could be patterned directly into the surface of a silicon wafer 14 to provide an integrated sensor array. FIGS. 6a and 6b show a representative top view of sensor modules. In particular FIG. 6a shows a layout of a sensor module 78 as applicable to the multiplexed architecture of FIG. 4. This sensor module includes DFP collection probes 48, surface temperature sensor 50 and four separate TDC sensors 52 along with bondable pad connections 110 to the various sensors. FIG. 6b shows a layout of a sensor module 78 as applicable to the serial architecture of FIG. 5. Along with the DFP collection probes 48, surface temperature sensor 50 and TDC sensors 52, this module also includes a secondary TDC bank 54 for local power generation, DC-DC converters 56, signal conditioning circuitry 60, a local microprocessor 98 with A/D 100 and isolated serial communications 102, and bondable pads connections for serial communications 112 and distribution of auxiliary power 114.

With respect to surface temperature sensing devices, there are three types that may be used. These include 1) thermocouples and thermistors that are encapsulated in integrated circuit package for surface mounting to the wafer and which provide a varying bi-metal voltage or electrical impedance with respect to temperature, 2) IC packaged thermocouple or thermistors which have integrated electronics and which provide a digital output of temperature and 3) thermocouple or thermistor devices that have been patterned and integrated into the surface of the wafer with conventional semiconductor-IC manufacturing methods. Those thermal sensors that are based on IC packages are economically advantageous in architectures where hybrid electronics are used, but because of their local thermal mass, they provide only an estimated measure of the wafer surface temperature. Sensors that are fabricated directly into the wafer surface are preferable because of their exactness, but their use can involve considerable cost in pattering and manufacture when compared to IC surface mount devices.

Detailed knowledge of plasma parameters in proximity to the wafer surface can be extremely helpful in understanding the dynamics of plasma-based processes. Spatial and temporal measurements of plasma parameters such as ion current flux, charged-particle density, electron energies (or apparent electron temperatures) and ion energies are physical parameters of the plasma that directly influence rates and quality of surface modification and material deposition and etching. In the preferred embodiment of this invention, the double-floating Langmuir probe or DFP is used to collect some of these plasma parameters. Described in the early 1950s, the double- floating Langmuir probe allows one to obtain I-V characteristics of a plasma between two conductive probes that are allowed to electrically float apart from an electrical common or ground. A detailed description of the DFP diagnostic technique and theory has been given by Swift, J. D. and Schwar, M. J. R., *Electric Probes for Plasma Diagnostics*, Chapter 7, pp. 137–155, (Elsevier, N.Y., 1969).

FIGS. 7a and 7b illustrate the basic working principles of the DFP. Two planar conductive probes 48 are isolated from the wafer surface 14 and exposed to plasma 34. A floating bias potential 116 is induced between the probes to force a net current 118 through the plasma and DFP circuit. When placed at relatively high bias potentials, the net DFP current is limited by ion current flux 120 to the negatively biased probe surface due to the rejection of electrons currents 122 to the probe; this is known as the ion saturation current. The ion current 124 and electron current 126 to the second probe compensate in order to sum all plasma currents to zero. When the probes are nearly symmetric and the plasma is relatively uniform across the surface, an I-V trace 128 is produced that is similar to back-to-back diode I-V characteristics shown in FIG. 7b. The saturating current regions 130 and 132 correspond to ion saturation currents 120 and 124 respectively. The intermediate region of the I-V curve 134 is determined by the electron currents 122 and 126 between the probes and may be used to determine the apparent electron temperature, $<T_e>$, which is indicative of "high-energy" electron population of the electron energy distribution as manifested at the boundary of the wafer surface 14.

The current characteristics versus bias voltage for a symmetric double-floating probe is approximated by $$I_{DFP} \cong I_{sat}^+ \cdot \tanh\left(\frac{e(V_0 - V_{DFP})}{T_e}\right) \quad (1)$$

where $I^+_{sat}$ is the ion saturation current, $V_0$ is the floating potential of the probes when no bias is applied, $V_{DFP}$ is the differentially applied probe voltage, and $T_e$ is the apparent electron temperature. Equation 1 may be modified to take into non-ideal situations that include effective probe area expansion with increasing bias potential, asymmetric probe areas, non-uniform plasmas and non-Maxwellian electron energy distributions. The conventional analysis that results in Eq. 1 is for a DC floating DFP case, but there is no-where in the prior art where workers experimentally or theoretically examined the DFP I-V characteristics when the DFP is placed on an RF-biased work piece. Without analysis or experimentation, one may suspect that an RF-bias 136 would distort the I-V characteristics and potentially confound the probe technique and analysis. Such distortion could be due to RF modulation of the plasma sheath boundary and potential disruption of electron currents 122 and 126 to the probe electrodes 48. As a result the I-V characteristics properties under RF-biased conditions might not resemble 128 or follow Eq. 1 when the wafer 14 is placed on an RF biased electrode, as often done in plasma processing systems.

Figure 8A:
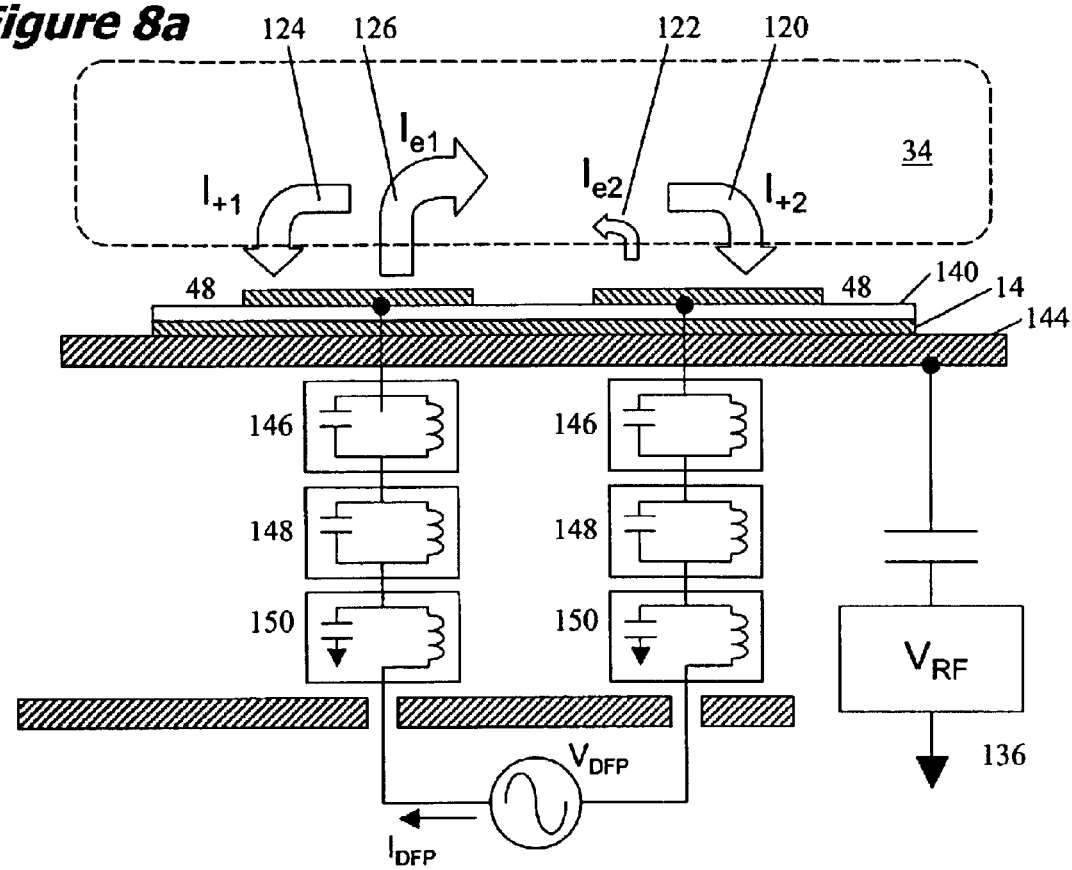
FIG. 8 illustrates a capacitively-coupled circuit for pulsing the DFP device and the typical current response when exposed to a plasma.
Figure 8B:
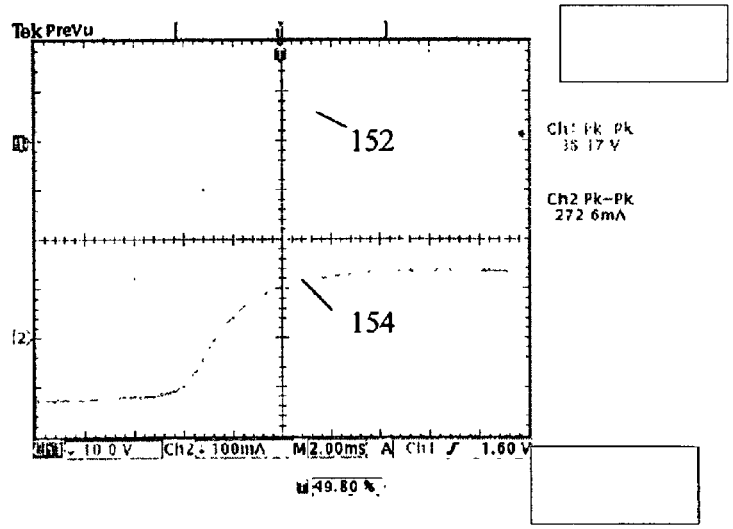

To see how the DFP sensor responds in the presence of an RF-bias signal, an arrangement shown in FIG. 8a was prepared in which several pairs of square DFP aluminum thin film probes 48 (~0.7 cm$^2$) were sputter-deposited over a 200 mm silicon wafer 14 with a ~1.5 um thick insulating oxide 140. The probes were attached to an external AC floating power source 142 that was swept with at peak differential voltage about 40 $V_{p-p}$ at 30 Hz to simulate a slow voltage sweep. Currents were sensed with a floating resistor and a differential voltage probe. The silicon wafer was placed in a commercial oxide etching chamber which had a 13.56 MHz inductively-coupled plasma source with planar induction coil (top) and a 13.56 MHz capacitively-coupled electrode (bottom) in a manner commonly used in high-density plasma semiconductor manufacture, i.e. with the wafer on the bottom capacitively-coupled electrode 144 to provide an RF induced self-bias in order to accelerate ions to the wafer surface. In order to inject the AC signals without disrupting the RF induced self-bias, two pairs of balanced series RF resonant choke filters tuned to 13.56 MHz 146 and 27.12 MHz 148 were placed in line with low pass filters 150 to allow external injection of the 30 Hz AC sweep yet allow the wafer and DFPs to follow RF signal and obtain an effective self-bias of several hundred volts of −100 to −300 V. Such RF blocking circuits have been commonly used in plasma-based diagnostic systems and manufacturing fixtures in order to mix DC or low frequency AC signals without perturbing concurrent RF-signals and circuitry within the processing system. The measured I-V trace of the DFP under RF self-bias conditions is shown in FIG. 8b. The oscilloscope trace shows the 30 Hz sinusoidal sweep 152 and the responding DPF current 154. After accounting for small displacement current offset due to parasitic capacitances between the probes and the shape of the sinusoidal DFP voltage sweep, it is clear that the measured I-V trend is virtually identical to that seen with no RF self-bias. This suggests that the DFP diagnostic method can effectively be used to sample plasma charged-particle characteristics even in the presence of an RF-induced negative self-bias of several hundreds of volts.

To corroborate the unexpected result and to make certain that the balanced RF blocking filter mechanism has no bearing on the experimental results, an analysis of the dual-floating Langmuir probe theory was made which included the effects of a high-amplitude common-mode RF signal, as induced by the RF self-bias, on top of the floating $V_{DPF}$ signal in the electron currents to the probes. The analysis assumes that ion transport across the plasma sheath above the RF-biased wafer is relatively constant with time as is the case when operating at well above 1 MHz. Provided this assumption, the classic I-V characteristics of the DFP diagnostic method given in Eq. 1 are retained, despite the presence of the high-amplitude common-mode RF signal. Thus both experimental and theoretical analysis show that the DFP diagnostic method can provide good measurements of ion saturation currents and apparent electron temperatures in accordance with the classical DFP diagnostic method. It should be noted that the experimental result and theoretical analysis for the DFP diagnostic as disposed on an RF-biased work piece have not been discussed or taught in the prior art, yet the unique result has great utility in that it provides a viable in situ plasma sensor for the apparatus of the present invention.

In order to practically implement the DFP diagnostic technique on an in situ sensor module, it is necessary to provide a floating probe bias mean that may be completely contained within the electrically floating apparatus. Such a means is illustrated in FIG. 9, wherein the DFP pads 48 are capacitively-coupled through isolation capacitors 156 and 158 to an input signal from a storage capacitor 160 and charge-pump circuit 162 tied to a floating common 164. In this circuit, two field effect transistors (FETs) 166 and 168 are used to allow the flow of current through DFP device and to reset the charging condition prior to sampling the DFP current and voltage. A sampling resistor 170 is used to sense DFP current and a voltage divider 172 is used to sample the DFP bias voltage level. The signal trends against time are also illustrated in FIG. 9. The representative signal levels show how the DPF current is allowed to flow through the circuit and plasma 34 once the $DFP_{pulse}$ FET 166 is turned on. At this time the apparatus microprocessor samples the $I_{DFP}$ current and DFP bias level. For repeated sampling under the same or different DFP bias levels, it is necessary to equalize or reset the charge state of the isolation capacitors 156 and 158. This is accomplished through a shunting FET 168 that is turned on between DFP pulses and A/D sampling. The circuit illustrated in FIG. 9 allows one to sample the DFP current and voltage dynamically as the bias voltage and responding DFP current relaxes in time or, alternatively, at discretely pulsed intervals and bias level as controlled through the charge-pump circuitry and timing of the DFP pulse and A/D sampling. Moreover, the circuit of FIG. 9 can be adapted to other electrically floating sensing devices such as photodiodes detection devices for light emission diagnostic methods, thermistors, various micro-electro-mechanical (MEM) sensors and other impedance-based sensing devices.

Figure 10:
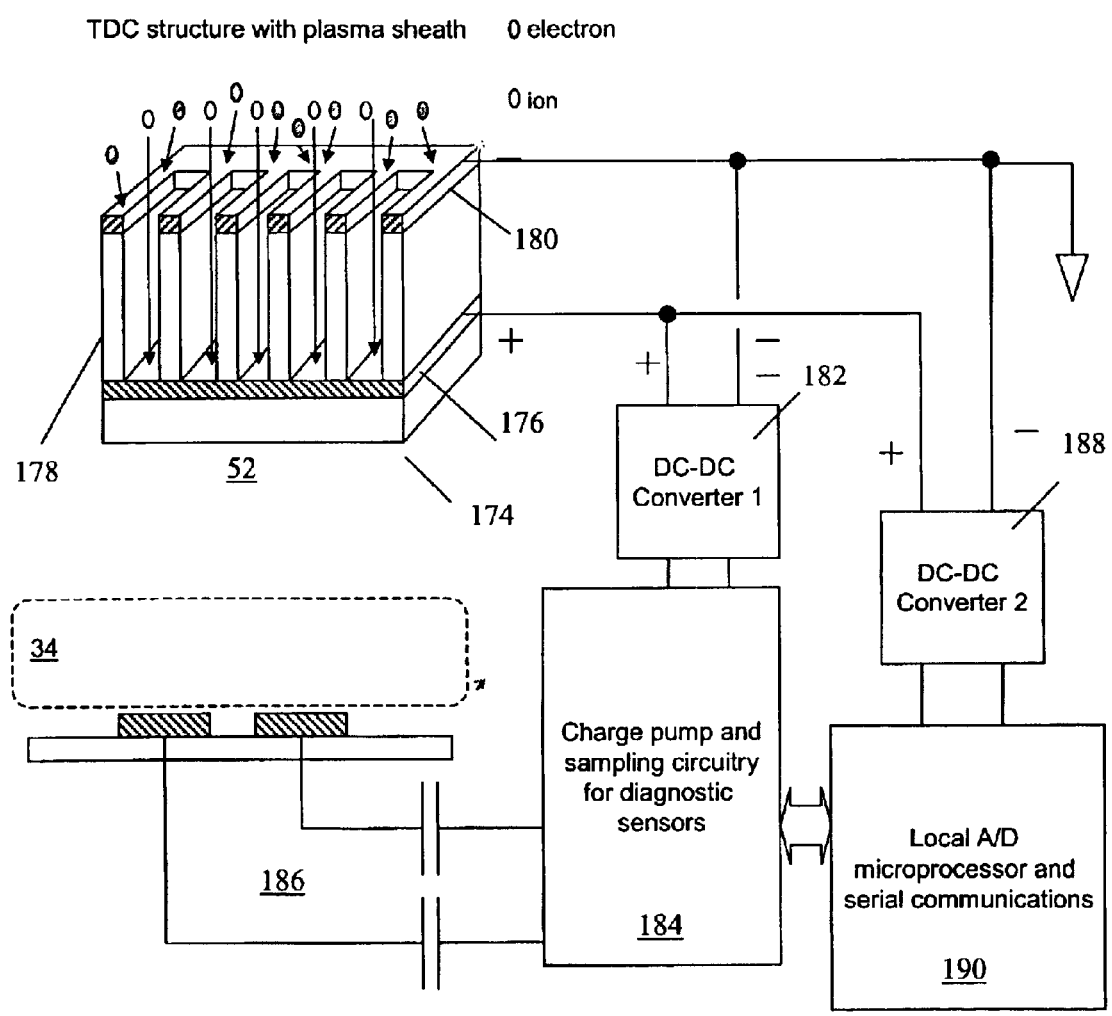
FIG. 10 illustrates how multiple TDC structures can be ganged together to provide power to one or more DC-to-DC converter sub-components in order to power multiple integrated sensors.

The topographically dependent charging (TDC) device is another component that has several possible applications in the apparatus of the present invention. FIG. 10 illustrates the general principles of the TDC device 52. The TDC device is generally comprised of a substrate 174, a lower conductive electrode 176, a patterned insulator with relatively high aspect ratio lines or holes with sub-micron dimensions 178 and a top conductive electrode 180. The typical dimensions for a TDC device is an opening of<1 um with aspect ratios that are about 5 or greater. For example, a typical TDC device may have a hole or line opening of 0.3 um and feature depth of 1–1.5 um. When exposed to a plasma, the differences in ion and electron transport to the top electrode 180 and the buried bottom electrode 176 results in a positive potential on the bottom electrode. This charging effect is well known in the industry since such charging effects can influence the quality producing high aspect ratio sub-micron features and can lead to surface charging effects that result in device damage during semiconductor IC manufacture.

This charging effect is well known in the industry since such charging effects can influence the quality producing high aspect ratio sub-micron features and can lead to surface charging effects that result in device damage during semiconductor IC manufacture. Such surface charging and potential charge damage effects are dependent upon the plasma conditions and spatial uniformity of the plasma. Thus one use of the TDC in the present invention is a monitor of static charges across various TDC devices with varying aspect ratios for spatial and temporal measure of surface charging effects.

An application of the TDC device is also shown in FIG. 10. In this case the TDC 52 provides a source of DC power to various electrical components and sub-systems that have been illustrated in the various proposed architectures. Since the TDC devices provide a DC potential from the charged carrier transport against the plasma boundary, they may be used as a continuously charged power source when the plasma is active. As with a battery or storage capacitor, a TDC-based power source would also need a DC-DC converter to adjust and regulate the power to appropriate DC voltage levels. In this application the top electrode 180 of the TDC is used as the local common. As an example, the TDC may power one DC-DC converter 182 for the charge pump and sampling circuitry 184 for the DFP diagnostic system 186 and a second DC-DC converter 188 to power a local microprocessor 190 used for sampling, A/D conversion and serial communications. The power available from the TDC device or bank of TDC devices is limited by the ion current flux collected at the base electrode 176 and effective DC potential when electrically connected to a load. A typical processing plasma system may have ion current flux densities on the order of 1–5 mA/cm$^2$, and under typical RF self-bias voltages of a few hundred volts, the charging of a TDC device may be several 10 s of volts. Thus the power density that may be derived is as much as much as 0.1 W/cm$^2$ for a TDC structure that has 40% open ion collection area. Thus a 1–2 cm$^2$ TDC device or bank exposed to a plasma could be integrated with a DC-DC converter to provide the same DC power of a 3.2 V coin battery with a peak trickle-current rating of about 30 mA. In general, the power derived from the TDC device may be used as an auxiliary source or DC power for sensor devices or for recharging of the main charge capacitor or battery.

Figure 11:
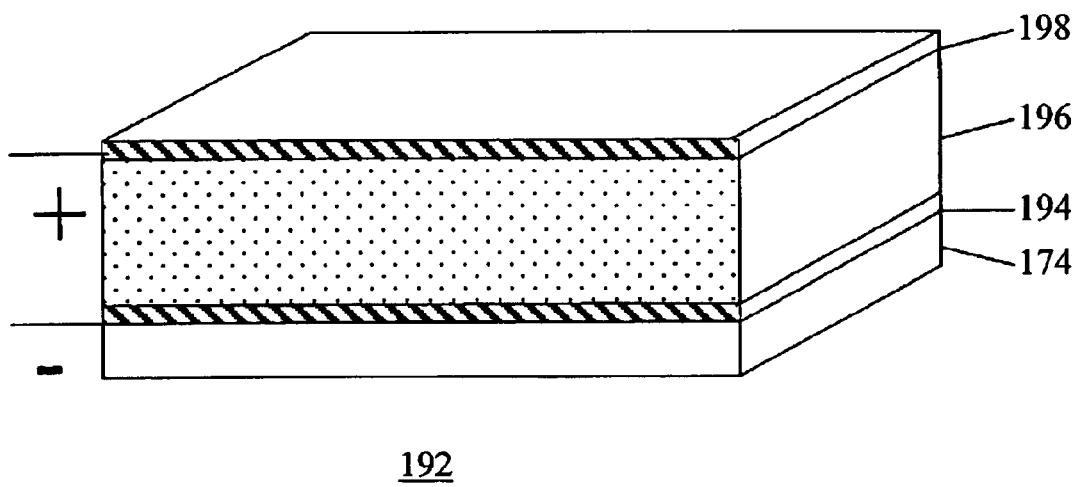
FIG. 11 illustrates an a surface charging structure utilizing stacked capacitors.

While we illustrate a TDC device for providing auxiliary electronic power from the plasma process, other chargeable structures, such as a thin film capacitor stack, which is patterned on the wafer surface, may also serve this purpose. As with the TDC structure, such a device can accumulate a net DC charge and thus provide a differential DC voltage when it is exposed an RF bias in a plasma process. This DC voltage may then be regulated by a DC-DC converter in order to power the device electronics or to recharge the device battery. The principle of such a charging capacitor 192 is illustrated in FIG. 11. In this illustration, the charging capacitor may be formed from a bottom conductive electrode 194 attached to the base of the substrate or wafer 174, an insulating thin film 196 and a top conductive electrode 198. Various multi-layer, inter-digitated capacitor configurations can be used to increase the capacitance. When the substrate is exposed to a plasma and, more particularly, to an RF bias, a net DC voltage is sustained across the insulator. With the appropriate selection of insulating film thickness, dielectric constant and capacitor area, a charging device may be constructed to provide the appropriate DC voltage and current capacity levels for auxiliary power generation. For example, such an electrically floating capacitive device with collection area of ~10 cm$^2$ can provide a net DC voltage on the order of 1 to 10 V and draw currents on the order of 100 s of microamperes.

Figure 12A:
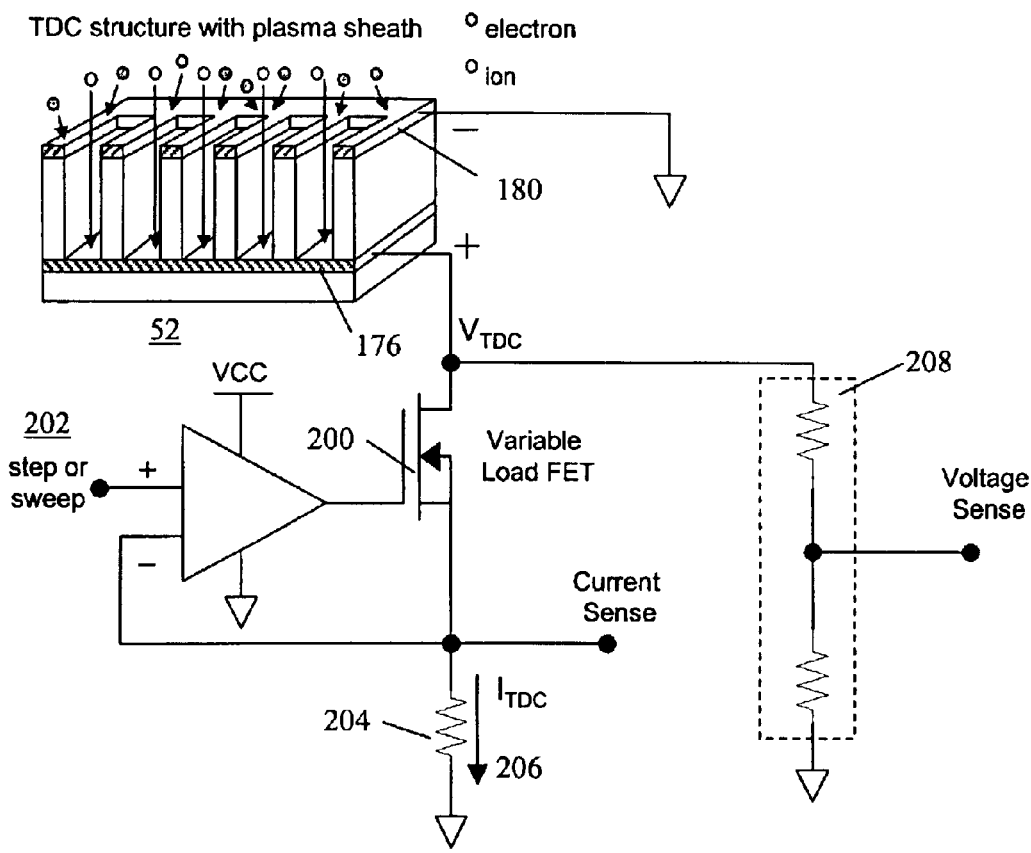
FIG. 12a illustrates how a TDC structure sensor can be dynamically loaded to obtain current and voltage characteristics for the purpose of measuring current flux and surface charging effects resulting from ion transport within the TDC structure.

FIG. 12a illustrates an application of the TDC for the apparatus of the present invention wherein the loaded I-V characteristics or "load-line" of the TDC device is probed. In this configuration, the bottom conductive electrode 176 of a TCD sensor device 52, or several TDC devices of varying aspect ratios, are individually tied to a FET 200. The FET is operated in a linear resistive region through a controlled gate voltage signal 202. The output of the FET is connected to a current sensing resistor 204 which is tied to common or the top electrode of the TDC 180 and, thereby, allows one to sample the draining TDC current 206 as the loading resistance of FET is changed. A high impedance voltage divider 208 is used to sample the voltage of the loaded TDC device. In this manner both one may collect a load-line characteristic of the TDC device when exposed to the processing plasma environment.

Figure 12B:
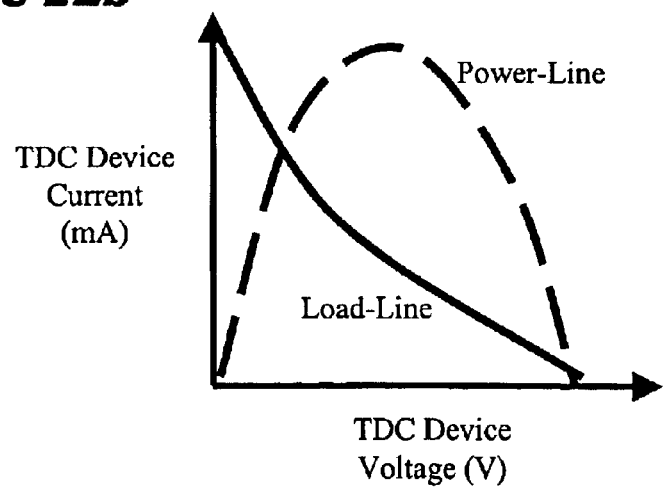
FIG. 12b is a graph that illustrates a load line and power line obtained from the loaded TDC device diagnostic circuit.

A typical load-line characteristic is illustrated in FIG. 12b as it might arise from a TDC structure. TDC structures with different aspect ratio may provide somewhat different load lines when exposed to different plasma processing environments and RF biases. As described earlier, the TDC device voltage and current arises from the differences between net ion and electron transport through the TDC structure when exposed to a plasma. When the top and bottom electrodes of the TDC device are connected (short circuit), it is possible to drive a current through the connection as the net negative electron flux is allowed to neutralize the net positive ion flux that reaches the bottom electrode. When the connection between top and bottom electrodes is open (open circuit), a voltage is sustained due to the imbalance of charged-particle fluxes and net accumulation of positive charge at the base of the device. The exemplary load-line characteristic of FIG. 12b shows the response of the TDC device's current and voltage as it is loaded between the shorted and open conditions. Aside from the aspect ratio and scale of the TDC structure, the TDC device load-line is determined by factors that influence the spatial density, effective mass, phase velocity and energy of charged species to the TDC. These factors can include gas pressure, plasma chemistry, power density, chamber surface conditions and RF bias levels. As such, a detailed measure of the load line response of one or several TDC devices can provide far more subtle information about the plasma processing conditions than just the open-circuit voltages or short-circuit currents. Moreover, the load-line provides a power line that can be used to match the output of TDC devices to DC-DC converter circuitry when using the TDC devices as a DC power source in the apparatus architecture.

It should be noted that while a FET is specifically used in this illustration as the means by which to collect the loaded I-V characteristics of the TDC sensing device, there may be other methods by which to electrically load the TDC device and sense the I-V response and, thereby, quantify the state of charged-particles of the plasma adjacent to the sensor.

While any practical method of fabrication may be used to form the probing component of the apparatus of the present invention, there are several pragmatic issues that have bearing on its ultimate use. Some of these issues include the selection of materials, limit in thermal range of operation, profile or height and balance, and chemical robustness and compatibility with the processing vacuum environment, and deign features to limit wear of components after cycled use. The following list emphasizes some of the common design constraints.

1) The probing component must be vacuum compatible and must not steadily outgas any significant compounds that would contaminate the process or process chamber. Also, when placed under high bias potential, the sputtered surface materials should not contaminate the process or process chamber.

2) For most applications related to plasma processes, the electrical components and materials placed into the vacuum processing chamber should be able to operate at the peak temperature levels usually observed. As an example, for common etching operations materials that are rated to 125° C. are appropriate.

3) For complex hybrid or ASIC-based circuitry that contain multiple interconnections to other sub-system electronics, hermetically sealed packaging should be used or monolithically thick dielectric coatings should be considered with optional use of metal electrostatic shielding from deposited thin films.

4) The overall height of the probing component that enters into the vacuum processing chamber should be small enough to pass through conventional load-lock gate valves and associated slits with the aid of conventional handling systems and robotics. This clearance height is usually 1 cm or less. The probing component should also be well balanced for manipulation with common handling mechanisms such as lifting pins, robotic paddles and rollers.

5) The probing device must be electrically self-contained and operable when placed in a plasma and stimulated with an RF-self bias, as would be the case for wafer or work piece in a conventional plasma processing system.

6) The apparatus should be constructed so as to allow wireless communications in either or two modes: first, in real-time from within processing system and second, post process download from the processing system chamber or load lock or from outside the processing system altogether.

7) The features and scale of sensor devices within the probing apparatus should be relatively small to allow spatial resolution of surface temperatures or plasma body properties. The scale of each sensor is preferably, but not limited to, 1 $cm^2$.

8) In order to capture a transient response of a process, it is desirable that the storage or reporting or real-time data be triggered by a sensor measurement such as an anticipated signal threshold, signal slope, or statistical deviation. As such it is desirable that apparatus be able to record sensor responses just before or at the advent of the process being monitored.

While thermal sensors, the DFP device and the TDC device have been mentioned in detail here, it is clearly understood by one skilled in the art that the apparatus may include any number of additional sensors. These may include MEMs devices, optical sensor, bulk resistivity devices that are sensitive to rates of etching, curing or deposition or inducement or magnetic fields. In some processes, MEMs devices might be particularly useful sensors in that they are often fashioned from materials that are compatible with plasma-based process environments. One examples of a useful MEMs device is a CMOS-based resonant beam sensor. Such sensors use a micro-machined cantilevered mechanism whose stimulated resonant frequency is dependent upon thermal and mass properties of the beam when exposed to the heat flux of the plasma, gaseous chemical absorbance, or mass changes due to reactive gas etching or deposition.

Some examples of useful MEMs sensor technology include the following devices. A single-chip resonant beam gas sensor as described by Hagleitiner et. al, "A single-chip CMOS Resonant Beam Gas Sensor" 2001 IEEE International Solid-State Circuits Conference, Feb. 6, 2001. This device which was designed to detect the mass absorption of volatile organic compounds could be used in conjunction with present invention to monitor the mass absorption, accumulation or removal as related to a plasma assisted process. Another example is a Hall magnetic sensor as described by Frounchi et al. "Integrated Hall Sensor Array Microsystem" 2001 IEEE International Solid-State Circuits Conference, Feb. 6, 2001. This integrated micro-sensor is a device for monitoring magnetic field strengths and could be used to monitor magnetic fields that are routinely used to enhance in plasma processing system to either control or enhance the process. Another device is micro-scale retarding field energy analyzer (or ion energy analyzer) as described by Blain, et al. "High-resolution submicron retarding field analyzer for low-temperature plasma analysis" Applied Physics Letters, Vol. 75, pp 3923, 1999. This device shows how a submicron-level ion energy analyzer could be constructed as a sensor on a patterned wafer. Such a device could be effectively operated with an electrical variant of dual floating probe circuitry as described earlier in order to obtain ion energy distributions for this type of analyzer. Yet another class of sensing technology are various integrated thin film optical photo sensor or photo spectrometer sensors that incorporate thin-film bandwidth specific optical filters that are fabricated with conventional CMOS chip fabrication methods. Optical emission and absorbance has been widely used to study the ultraviolet, optical and infrared spectra of processing plasmas for process development and control.

Optical sensors such as photodiodes, with or without passive optical filtering, can also be used to measure optical emission as radiated to the surface of the work piece. Use of multiple optical emissions sensors can enable the measure of multiple wavelength intensities as would be required for in situ actinometry or other optical emission spectroscopy methods.

The self-contained DC power source or reservoir may be formed provided by a number of means. Low-profile, commercially available coin-style batteries are widely available and can be used if they meet thermal specifications, trickle current levels, mA/hr ratings and are packaged (i.e. hermetically sealed) so as not to outgas electrolytic compounds. Also it is possible to use thin-film, multi-layer charge-capacitors devices which may be re-charged prior to use or within the plasma process from an optional TDC device and DC-DC converter. Yet other variations of low profile batteries, re-chargeable batteries, and charge-storage capacitors can be incorporated into the design to provide power to the apparatus during the plasma process or for external testing, device configuration and calibration when outside of the plasma processing system.

Although there is illustrated and described specific structure and details of operation, it is clearly understood that the same were merely for purposes of illustration and that changes and modifications may be readily made therein by those skilled in the art without departing from the spirit and the scope of this invention.

What we claim is:

1. An apparatus for obtaining measurements in a plasma processing system including:
   a) a substrate placed into plasma processing system and that is exposed to the plasma;
   b) at least one integrated electrically floating plasma sensor disposed on the substrate for the purpose of obtaining measurements of a plasma property in the plasma processing system; and
   c) a first wireless communication transceiver mounted on the substrate disposed to transmit sensor measurement data from the substrate outside the plasma processing system.

2. An apparatus for obtaining measurements in a plasma processing system as defined in claim 1 wherein the at least one integrated electrically floating plasma sensor comprises a dual floating Langmuir probe.

3. An apparatus for obtaining measurements in a plasma processing system as defined in claim 1 wherein the at least one integrated electrically floating plasma sensor comprises a topographically dependant charging device.

4. An apparatus for obtaining measurements in a plasma processing system as defined in claim 1 further comprising a temperature measuring device.

5. An apparatus for obtaining measurements in a plasma processing system as defined in claim 1 further comprising a resonant beam gas sensor.

6. An apparatus for obtaining measurements in a plasma processing system as defined in claim 1 further comprising a hall magnetic sensor.

7. An apparatus for obtaining measurements in a plasma processing system as defined in claim 1 further comprising a self contained power source.

8. An apparatus for obtaining measurements in a plasma processing system as defined in claim 7 wherein the self contained power source is a battery.

9. An apparatus for obtaining measurements in a plasma processing system as defined in claim 7 wherein the self contained power source is comprised of a topographically dependent charging device.

10. An apparatus for obtaining measurements in a plasma processing system as defined in claim 7 wherein the self contained power source is comprised of a surface charging structure utilizing stacked capacitors.

11. An apparatus for obtaining measurements in a plasma processing system as defined in claim 1 further comprising a microprocessor mounted on the substrate and disposed to receive and process input signals from the at least one integrated electrically floating plasma sensor.

12. An apparatus for obtaining measurements in a plasma processing system as defined in claim 1 further comprising a second wireless communication transceiver disposed outside the plasma processing system to receive sensor measurement data from the first transceiver.

13. An apparatus for obtaining measurements in a plasma processing system as defined in claim 12 further comprising a computer for receiving the information from the second transceiver and that is disposed to download the sensor measurement data.

14. An apparatus for obtaining measurements in a plasma processing system as defined in claim 1 wherein the at least one integrated electrically floating plasma sensor comprises a plurality of dual floating Langmuir probes.

15. An apparatus for obtaining measurements in a plasma processing system as defined in claim 1 wherein the at least one integrated electrically floating plasma sensor is dynamically pulsed to obtain measurements of the plasma in the plasma processing system.

* * * * *